(12) United States Patent
Srivastava (10) Patent No.: US 11,823,035 B2
(45) Date of Patent: Nov. 21, 2023

(54) POWER-EFFICIENT COMPUTE-IN-MEMORY POOLING

(71) Applicant: QUALCOMM Incorporated, San Diego, CA (US)

(72) Inventor: Ankit Srivastava, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 806 days.

(21) Appl. No.: 16/922,953

(22) Filed: Jul. 7, 2020

(65) Prior Publication Data

US 2022/0012580 A1    Jan. 13, 2022

(51) Int. Cl.
| | |
|---|---|
| *G06F 7/544* | (2006.01) |
| *G06N 3/065* | (2023.01) |
| *H03M 1/46* | (2006.01) |
| *G11C 11/419* | (2006.01) |
| *G06N 3/04* | (2023.01) |
| *G11C 11/412* | (2006.01) |
| *G11C 11/54* | (2006.01) |
| *G11C 27/02* | (2006.01) |

(Continued)

(52) U.S. Cl.
CPC ........... *G06N 3/065* (2023.01); *G06F 7/5443* (2013.01); *G06N 3/04* (2013.01); *G11C 7/16* (2013.01); *G11C 11/412* (2013.01); *G11C 11/419* (2013.01); *G11C 11/54* (2013.01); *G11C 27/026* (2013.01); *H03M 1/466* (2013.01); *H03M 1/38* (2013.01)

(58) Field of Classification Search
CPC ....... G11C 7/16; G11C 11/412; G11C 11/419; G11C 11/54; G11C 27/026; G11C 11/4096; G11C 7/1006; G06N 3/065; G06N 3/04; G06N 3/045; G06F 7/5443; G06F 2207/4802; H03M 1/466; H03M 1/38; H03M 1/468

See application file for complete search history.

(56) References Cited

U.S. PATENT DOCUMENTS

| | | | | |
|---|---|---|---|---|
| 9,660,660 B1 * | 5/2017 | Beukema | ............... | H03M 1/069 |
| 10,483,994 B2 * | 11/2019 | Mitikiri | ............... | H03M 1/0881 |
| 11,018,687 B1 * | 5/2021 | Srivastava | ............... | G11C 11/54 |

(Continued)

FOREIGN PATENT DOCUMENTS

| | | |
|---|---|---|
| CN | 110363292 A | 10/2019 |
| WO | 2019015541 A1 | 1/2019 |

OTHER PUBLICATIONS

Shafiee A., et al., "ISAAC: A Convolutional Neural Network Accelerator with In-Situ Analog Arithmetic in Crossbars", 2016 ACM/IEEE 43rd Annual International Symposium on Computer Architecture (ISCA), 2016, 14 pages.

*Primary Examiner* — Khamdan N. Alrobaie
(74) *Attorney, Agent, or Firm* — QUALCOMM Incorporated (57) ABSTRACT

A multiply-and-accumulate (MAC) circuit having a plurality of compute-in-memory bitcells is configured to multiply a plurality of stored weight bits with a plurality of input bits to provide a MAC output voltage. A successive approximation analog-to-digital converter includes a capacitive-digital-to-analog-converter (CDAC) configured to subtract a bias voltage from the MAC output voltage to provide a CDAC output voltage. A comparator compares the CDAC output voltage to a fixed reference voltage.

25 Claims, 9 Drawing Sheets

(51) Int. Cl.
*G11C 7/16* (2006.01)
*H03M 1/38* (2006.01)

(56) References Cited

U.S. PATENT DOCUMENTS

| | | | |
|---|---|---|---|
| 2012/0081246 A1* | 4/2012 | Caci | H03M 1/1215 |
| | | | 341/155 |
| 2014/0132431 A1* | 5/2014 | Steensgaard-Madsen | ................... |
| | | | H03M 1/0668 |
| | | | 341/131 |
| 2015/0263756 A1* | 9/2015 | Chiu | H03M 1/08 |
| | | | 341/172 |
| 2016/0232951 A1* | 8/2016 | Shanbhag | G11C 11/419 |
| 2017/0019122 A1* | 1/2017 | Onishi | H03M 3/51 |
| 2018/0113649 A1 | 4/2018 | Shafiee et al. | |
| 2019/0042199 A1* | 2/2019 | Sumbul | G11C 7/12 |
| 2019/0080231 A1 | 3/2019 | Nestler et al. | |
| 2019/0102170 A1* | 4/2019 | Chen | G11C 7/16 |
| 2020/0014396 A1* | 1/2020 | Aboudina | H03M 1/468 |
| 2020/0364548 A1* | 11/2020 | Chang | G06N 3/063 |
| 2021/0192324 A1* | 6/2021 | Srivastava | G06J 1/00 |
| 2022/0276835 A1* | 9/2022 | Yang | G11C 11/54 |
| 2023/0122233 A1* | 4/2023 | Walsh | G06F 3/044 |
| | | | 307/125 |

\* cited by examiner

POWER-EFFICIENT COMPUTE-IN-MEMORY POOLING

TECHNICAL FIELD

This application relates to compute-in-memories, and more particularly to power-efficient compute-in-memory pooling applications.

BACKGROUND

Computer processing of data typically uses a Von Neumann architecture in which the data is retrieved from a memory to be processed in an arithmetic-and-logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

SUMMARY

In accordance with a first aspect of the disclosure, a system for a machine learning application is provided that includes: a first multiply-and-accumulate (MAC) circuit including a first plurality of compute-in-memory bitcells configured to multiply a plurality of stored weights with an input vector to provide a first MAC output voltage; and an analog-to-digital converter configured to digitize the first MAC output voltage, the analog-to-digital converter including: a first capacitive digital-to-analog converter (CDAC) configured to subtract a bias voltage from the first MAC output voltage to provide a first CDAC output voltage; and a first comparator configured to compare the first CDAC output voltage to a reference voltage to provide a first comparator output signal.

In accordance with a second aspect of the disclosure, a system for a machine learning application is provided that includes: a first multiply-and-accumulate (MAC) circuit including a first plurality of compute-in-memory bitcells configured to multiply a first plurality of stored weights with an input vector to provide a first MAC output voltage; a second multiply-and-accumulate (MAC) circuit including a second plurality of compute-in-memory bitcells configured to multiply a second plurality of stored weights with the input vector to provide a second MAC output voltage; and an analog-to-digital converter configured to digitize either the first MAC output voltage or the second MAC output voltage, the analog-to-digital converter including: a first sampling switch; a second sampling switch; a first capacitive digital-to-analog converter (CDAC) configured to sample the first MAC output voltage through the first sampling switch to provide a sampled first MAC output voltage and to subtract a first bias voltage from the sampled first MAC output voltage to provide a first CDAC output voltage; a second capacitive digital-to-analog converter (CDAC) configured to sample the second MAC output voltage through the second sampling switch to provide a sampled second MAC output voltage and to subtract a second bias voltage from the sampled second MAC output voltage to provide a second CDAC output voltage; and a comparator configured to assert a comparator output signal responsive to the first CDAC output voltage being greater than the second CDAC output voltage.

In accordance with a third aspect of the disclosure, a system for a machine learning application is provided that includes: a multiply-and-accumulate (MAC) circuit including a plurality of compute-in-memory bitcells configured to multiply a plurality of stored weights with a first input vector to provide a first MAC output voltage and to multiply the plurality of stored weights with a second input vector to provide a second MAC output voltage; and an analog-to-digital converter configured to digitize either the first MAC output voltage or the second MAC output voltage, the analog-to-digital converter including: a capacitive digital-to-analog converter (CDAC) configured to subtract a bias voltage from the first MAC output voltage to provide a first CDAC output voltage and to subtract the bias voltage from the second MAC output voltage to provide a second CDAC output voltage; a comparator configured to compare the first CDAC output voltage to a reference voltage to provide a first comparator output signal responsive to a first assertion of a local enable signal; and a logic gate configured to perform a second assertion of the local enable signal responsive to the first comparator output signal being false, wherein the comparator is further configured to compare the second CDAC output voltage to the reference voltage responsive to the second assertion of the local enable signal.

In accordance with a fourth aspect of the disclosure, a system for a machine learning application is provided that includes: a multiply-and-accumulate (MAC) circuit including a plurality of compute-in-memory bitcells configured to multiply a plurality of stored weights with a first input vector to provide a first MAC output voltage and to multiply the plurality of stored weights with a second input vector to provide a second MAC output voltage; and an analog-to-digital converter configured to digitize either the first MAC output voltage or the second MAC output voltage, the analog-to-digital converter including: a first sampling switch; a second sampling switch; a first capacitive digital-to-analog converter (CDAC) configured to sample the first MAC output voltage through the first sampling switch to provide a sampled first MAC output voltage; and a second capacitive digital-to-analog converter (CDAC) configured to sample the second MAC output voltage through the second sampling switch to provide a sampled second MAC output voltage; an averaging switch coupled between the first CDAC and the second CDAC, wherein the averaging switch is configured to close to average the sampled first MAC output voltage with the sampled second MAC output voltage to provide an averaged MAC output voltage; and a comparator configured to compare the averaged MAC output voltage to a reference voltage to provide a comparator output signal.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In deep learning and other machine learning applications, a convolutional layer is a fundamental building block. A convolutional layer includes a collection of nodes for the multiplication of filter weights with an input vector from a previous layer (or from input data such as an image being analyzed). Each node stores a corresponding filter weight bit that is multiplied by a corresponding input bit from the input vector. Since each node in a convolutional layer is performing a multiplication of a binary filter weight with a corresponding binary input, it is convenient to implement each node for a convolutional layer using a corresponding compute-in-memory bitcell. Should a filter weight be a multi-bit filter weight, the corresponding node for the filter weight would include a plurality of compute-in-memory bitcells for storing the bits for the multi-bit filter weight.

Within a convolutional layer, a collection of compute-in-memory bitcells that are organized into a compute-in-memory (CiM) multiply-and-accumulate (MAC) circuit are designated as a filter. The output of the CiM MAC circuit represents the multiplication of the stored filter weight bits with the corresponding input bits for the filter. For example, suppose the filter has the dimensions of 2 by 2 by 2. There are thus eight filter weights in such a filter that are multiplied by the corresponding inputs. The resulting CiM MAC circuit performs eight multiplications and sums them to form a MAC output voltage that is digitized to provide an output signal that is propagated to the next layer.

A particularly advantageous analog CiM MAC circuit is disclosed that provides a rail-to-rail (ground to the power supply voltage) filter output for low-power deep learning and other artificial intelligence applications. As compared to a digital implementation, an analog CiM MAC architecture consumes less power. But the analog output from an analog CiM MAC circuit needs to be digitized by an analog-to-digital converter (ADC) that would conventionally require a full-rail comparator. As known in the digital electronic arts, a comparator functions to compare two analog input signals to each other. Depending upon which input signal is greater, a comparator either asserts its output signal to the power supply voltage VDD or to ground. The power supply voltage VDD is carried on a power supply lead or conductor commonly referred to as a power supply rail. If an input signal voltage can range from ground to the power supply voltage VDD, such an input signal is a "full-rail" input signal since it can range from ground to the rail voltage. If both input signals to the comparator are full-rail signals, the design for such a full-rail comparator is more demanding as contrasted to a comparator in which one of the input signals has a fixed mid-range voltage (e.g., VDD/2). An ADC is provided herein that advantageously eliminates the need for a full-rail comparator as will be further explained herein. Note that the analog compute-in-memory bitcells in the analog CiM MAC are more complex than a corresponding conventional bitcell such as a six-transistor static-random-access-memory (SRAM) bitcell since a compute-in-memory bitcell not only stores its filter weight but also implements a logic gate such as an exclusive-not-OR (XNOR) or an exclusive-OR (XOR) gate for the multiplication of the stored filter weight with the corresponding input bit. The storage of the filter weight in the compute-in-memory bitcell may be implemented using either an SRAM or a dynamic random access memory (DRAM) architecture. A particularly advantageous compute-in-memory SRAM bitcell will be discussed further herein. But it will be appreciated that the compute-in-memory architectures disclosed herein are widely applicable to any suitable compute-in-memory bitcell implementation including a DRAM CiM bitcell architecture. It will thus be appreciated that the following claims are not limited to SRAM bitcell implementations unless such a limitation is expressly stated.

Figure 1A:
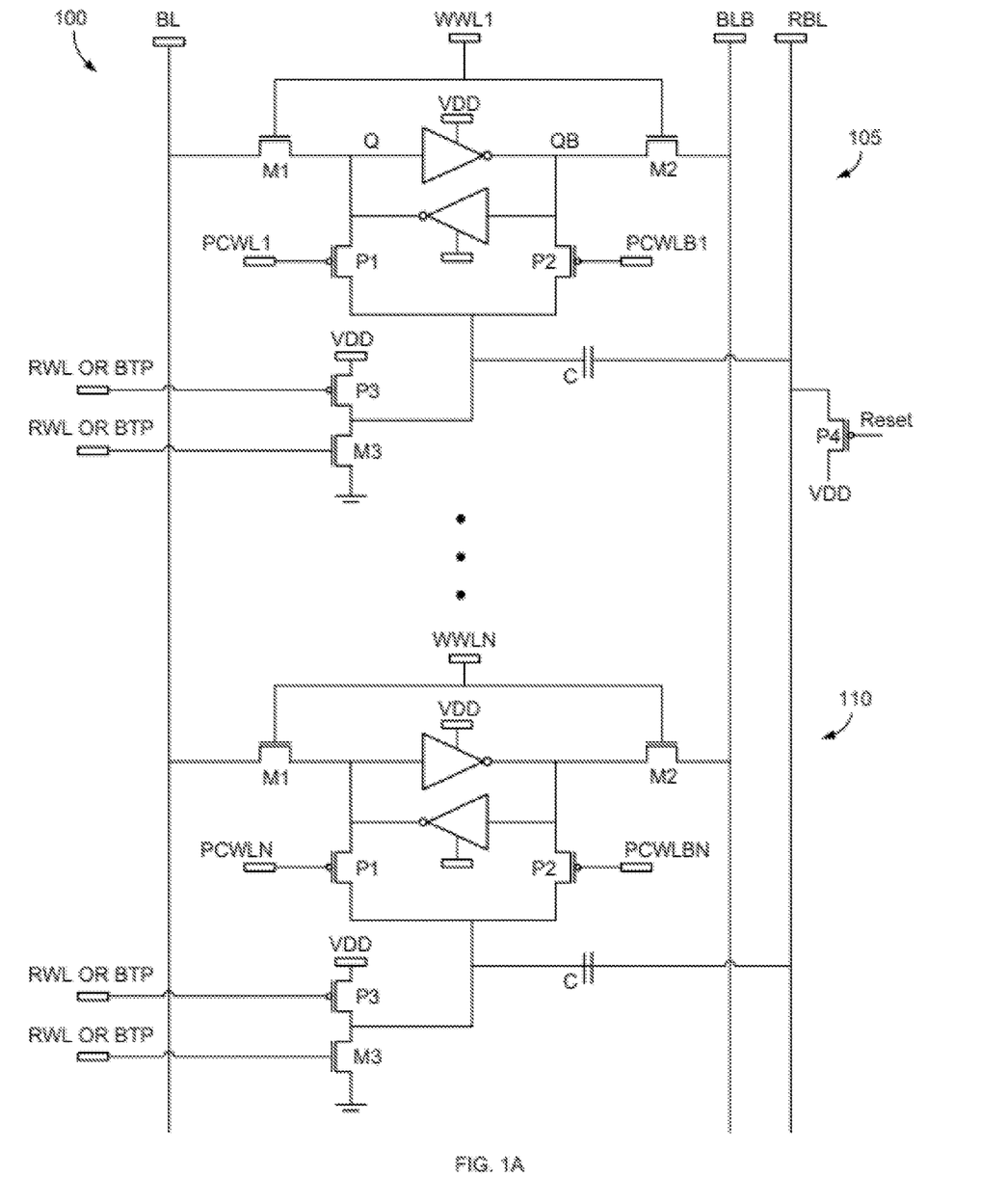
FIG. 1A illustrates an example multiply-and-accumulate (MAC) circuit for calculating a filter output in a compute-in-memory machine learning application.

Each compute-in-memory SRAM bitcell stores a filter weight bit using two cross-coupled inverters. An example CiM MAC circuit 100 is shown in FIG. 1A that includes a plurality of N CiM bitcells ranging from a first bitcell 105 to an Nth bitcell 110 but it will be appreciated that the number N of CiM bitcells will depend upon the filter dimensions. The terms "filter" and "MAC circuit" are used interchangeably herein. Each compute-in-memory SRAM bitcell is substantially identical so the following discussion for bitcell 105 is equally applicable to all the remaining bitcells in CiM MAC circuit 100. Bitcell 105 includes a pair of cross-coupled inverters that store the filter weight bit on a true output node Q and also store a complement of the bit on a complement output node QB. As known in the SRAM arts, the filter weight bit for bitcell 105 was written from a bit line BL and a complement bit line BLB when a first write word line (WWL1) is asserted to a power supply voltage VDD to switch on a corresponding pair of NMOS access transistors M1 and M2. The true output node Q connects to a source of a p-type metal-oxide semiconductor (PMOS) first pass transistor P1 that has its drain connected to a second plate of a capacitor C and to a drain of an n-type metal-oxide semiconductor (NMOS) reset transistor M3. Similarly, the complement output node QB connects to a source of a PMOS second pass transistor P2 that has its drain connected to the second plate of capacitor C and to the drain of reset transistor M3. An active-low input vector bit carried on a first pre-charge word line PCWL1 controls the gate of first pass transistor P1. Similarly, a complement of the active-low input vector bit carried on a first complement pre-charge word line PCWLB1 controls the gate of second pass transistor P2. For brevity, a pre-charge word line such as PCWL1 is also denoted as a word line herein.

A first plate of capacitor C connects to a read bit line RBL that extends across all the bitcells in CiM MAC circuit 100. Prior to a calculation phase, the capacitor C is reset in a reset phase for compute-in-memory bitcell 105. During the reset phase, an active-low reset signal carried on a reset line is asserted to switch on a PMOS transistor P4 connected between the read bit line RBL and a node for the power supply voltage VDD. The read bit line is thus charged to the power supply voltage VDD during the reset phase. While the reset signal is asserted, a read word line (RWL) is also asserted that connects to a gate of reset transistor M3. A source of reset transistor M3 is connected to ground so that when the read word line is asserted, reset transistor M3 switches on to ground the second plate of capacitor C. The capacitor C is thus charged to the power supply voltage VDD during the reset phase. During the reset phase, both the pre-charge word line PCWL1 and the complement pre-charge word line PCWLB1 are charged to the power supply voltage VDD to maintain both pass transistors P1 and P2 off.

In a calculation phase to calculate the binary multiplication of the stored bit and the input vector bit in bitcell 105, the pre-charge word line PCWL1 and the complement pre-charge word line PCWLB1 are charged according to the value of the input vector bit for bitcell 105 while the reset signal is asserted to keep the read bit line RBL charged to the power supply voltage VDD. The read word line RWL is de-asserted during the calculation phase so that the second plate of the capacitor C floats with respect to ground during the calculation phase. In an active-low embodiment in which a true input vector bit is ground and a false input vector bit is VDD, the pre-charge word line PCWL1 is discharged if the input vector bit is true. At the same time, the complement pre-charge word line PCWLB1 is then charged high to the power supply voltage VDD. Conversely, if the input vector bit is false in an active-low embodiment, the pre-charge word line PCWL1 is charged to the power supply voltage VDD while the complement pre-charge word line PCWLB1 is discharged. If the pre-charge word line PCWL1 is discharged due to the true value of the input vector bit and the stored weight bit is also true, pass transistor P1 will switch on to charge the second plate of the capacitor C to the power supply voltage VDD. Since the read bit line RBL is connected to the power supply node for the power supply voltage VDD, the capacitor C is thus discharged due to the charging of its second plate. The same discharge for capacitor C occurs when both the filter weight bit and the input vector bit are false. In that case, second pass transistor P2 switches on to charge the second plate of the capacitor C during the calculation phase. But if the input vector bit and the stored bit have complementary binary values, the second plate then stays discharged so that the capacitor C remains charged. The resulting multiplication is thus an XNOR of the input vector bit and the filter weight bit. On the other hand, the multiplication would be an XOR of the input vector bit and the filter weight bit if the input vector bit is an active-high signal (note that a true active-high signal is the power supply voltage VDD whereas a false active-high signal is ground).

The same reset phase and calculation phase occurs for the remaining bitcells such as bitcell 110. Each bitcell has its own corresponding pre-charge word line and complement pre-charge word line. For example, bitcell 110 responds to an Nth precharge word line PCWLN and an Nth complement pre-charge word line PCWLBN. Similarly, each bitcell is written to by its own corresponding write word line. For example, an Nth write word line WWLN is asserted to write the corresponding filter weight bit into bitcell 110.

An accumulation phase follows the calculation phase. In the accumulation phase, the read word line RWL is asserted while the active-low reset signal is de-asserted (charged to VDD). The read bit line RBL is thus isolated during the accumulation phase from the power supply node because transistor P4 switches off. The second plate of the capacitor C is grounded during the accumulation phase as reset transistor M3 is switched on due to the assertion of the read word line to the power supply voltage VDD. If capacitor C had been discharged in bitcell 105, the read bit line voltage will thus be decreased from the power supply voltage VDD. Conversely, capacitor C will support the read bit line voltage if capacitor C had remained charged. The accumulation phase for the bitcells such as bitcell 110 each occurs at the same time and affects the read bit line voltage in the same fashion. The output voltage of analog CiM MAC circuit 100 is thus the resulting read bit line voltage after the accumulation phase for all its bitcells.

To provide greater flexibility, note that the second plate of the capacitor C in each bitcell may be charged to the power supply voltage VDD through a corresponding PMOS transistor P3. For example, transistor P3 in bitcell 105 has a source connected to the power supply node VDD and a drain connected to the second plate of capacitor C. The addition of transistor P3 is also advantageous as capacitor C can be reused as part of a capacitor digital-to-analog converter (CDAC) as discussed further herein. After CiM MAC 100 has finished the accumulation phase, the read word line voltage may be sampled by another capacitor (not illustrated). With the sampled voltage captured by this additional capacitor, the read bit line may then be discharged to ground. The resulting sampled voltage may then be selectively boosted by driving the second plates of selected ones of capacitors C to the power supply voltage VDD by switching on transistors P3 in the selected compute-in-memory bitcells in the column. In particular, a DAC signal BTP such as controlled by a finite state machine (not illustrated) is discharged for the selected compute-in-memory bitcells to boost the sampled voltage. The remaining compute-in-memory bitcells in CiM MAC circuit 100 would float the second plate for their capacitor C so as to not affect the desired boosting. Alternatively, the sampled voltage may be selectively decremented by grounding the second plates of selected ones of capacitors C by switching on reset transistors M3 in the selected compute-in-memory bitcells by asserting their DAC signal BTP.

Figure 1B:
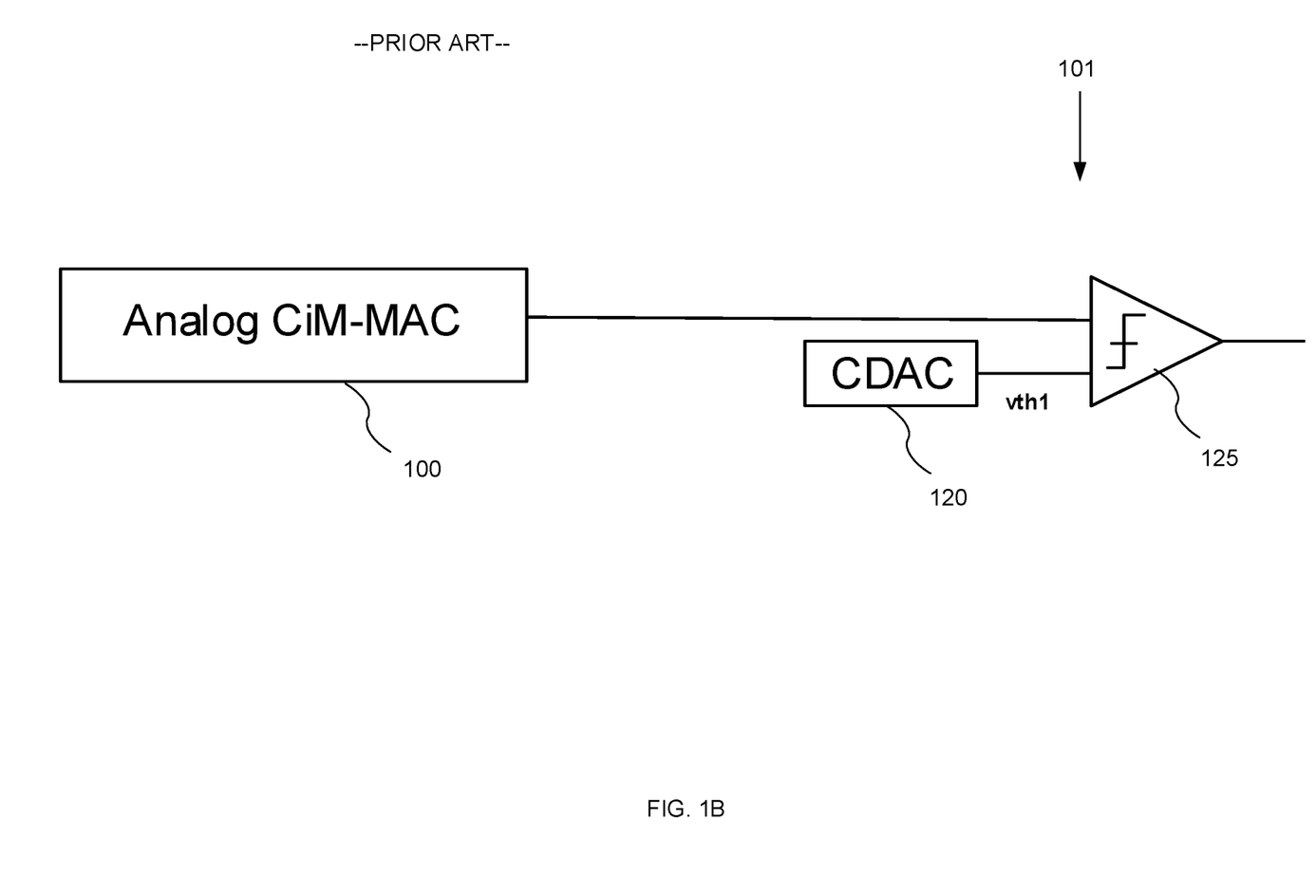
FIG. 1B illustrates a conventional ADC for digitizing the output from a MAC circuit in a compute-in-memory machine learning application.

As discussed earlier, it would be conventional for an analog CiM MAC circuit such as CiM MAC circuit 100 to provide its read bit line voltage to an ADC that includes a CDAC and a full-rail comparator. An example conventional successive approximation ADC 101 for digitizing the MAC output voltage from CiM MAC circuit 100 is shown in FIG. 1B. A CDAC 120 converts a digital input (not illustrated) into an analog threshold voltage (Vth1) that drives an input of a comparator 125. Comparator 125 compares the threshold voltage Vth1 to the analog output voltage to make a bit decision for the digitization of the MAC output voltage. The MAC output voltage can range from ground to a power supply voltage VDD. CDAC 120 must then adjust the threshold voltage accordingly to calculate the various bits for digitization. For example, a control logic circuit such as a finite state machine (not illustrated) generates a digital input to CDAC 120 to set the threshold voltage Vth1 to VDD/2 initially. If comparator 125 indicates that the analog output voltage is greater than VDD/2, ADC 101 sets a first bit of the digital result as stored in a set of registers (not illustrated). The control logic circuit may then command CDAC 120 to increase the threshold voltage Vth1 to ¾*VDD followed by a comparison of the analog output voltage and the new threshold voltage to determine another bit of the digital result. In this fashion, CDAC 120 may increase or decrease the threshold voltage Vth1 as necessary in a binary progressive fashion until all the bits of the digital result are determined. But note that comparator 125 must then be a "full rail" comparator in that the two signals being compared range virtually from ground to the power supply voltage VDD. Such a full-rail comparator consumes a substantial amount of power.

Figure 2:
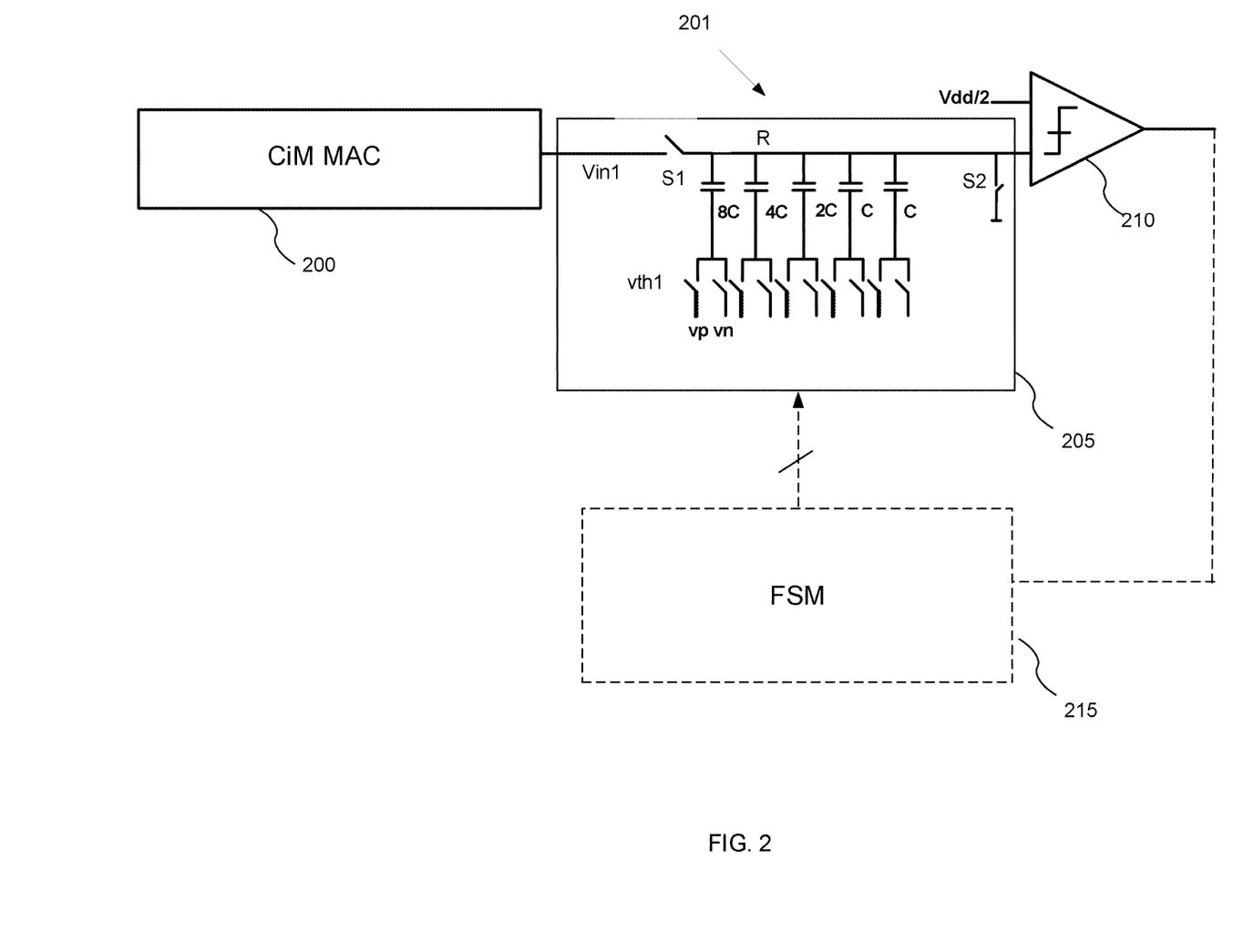
FIG. 2 illustrates a successive approximation ADC for digitizing the output from a MAC circuit in a compute-in-memory machine learning application in accordance with an aspect of the disclosure.

A successive approximation ADC 201 shown in FIG. 2 advantageously does not need a full-rail comparator. ADC 201 digitizes a MAC output voltage (Vin1) from a CiM MAC circuit 200. CiM MAC circuit 200 may be arranged such as discussed for CiM MAC circuit 100. ADC 201 digitizes the MAC output voltage using a CDAC 205 and a comparator 210. But note that the MAC output voltage does not drive the comparator. Instead, the CDAC 205 samples the MAC output voltage such as through a sampling switch S1 to charge a sampling rail R. The sampled MAC output voltage thus functions as a voltage input to CDAC 205 that in conventional operation would be converted into the threshold voltage Vth1. CDAC 205 is a 3-bit converter and thus includes a binary progression of capacitors C, 2C, 4C, and 8C as well as the dummy least-significant bit (LSB) capacitor C. There are thus two capacitors C in CDAC 205. It will be appreciated, however, that the CDAC bit precision may be greater than or less than 3 bits in alternative implementations. Each capacitor has a first plate attached to the sampling rail R and a second plate connected through a pair of switches to either a node for the power supply voltage Vdd (denoted as vp) or to ground (denoted as vn). Referring again to MAC 100, note that the CiM bitcells may be repurposed to function in CDAC 205 since the switching on of the bitcell's transistor P3 functions as the switch to vp. Similarly, the switching on of a bitcell's transistor M3 functions as the switch to vn.

In a binary implementation for ADC 201, it would be conventional for CDAC 205 to adjust its capacitors so that the sampling rail voltage equals the MAC output voltage minus the threshold voltage Vth1 as discussed previously. But CDAC 205 instead subtracts a bias voltage (Vth1−Vdd/2) from the MAC output voltage Vin1, where Vdd is the power supply voltage. Comparator 210 may thus compare the resulting sampling rail voltage to a reference voltage such as one-half of the power supply voltage Vdd. Since comparator 210 compares using the fixed voltage Vdd/2, the design of comparator 210 is relaxed as compared to a conventional full-rail comparator such as comparator 125. In a binary embodiment for ADC 201, the output of comparator 210 is the one-bit digitization of the MAC output voltage Vin1. In a multi-bit embodiment for ADC 201, a control logic circuit such as a finite state machine (FSM) 215 controls CDAC 205 to adjust Vth1 to calculate the additional bits in successive comparisons by comparator 210 analogously as discussed for CDAC 120. To reset after a conversion, CDAC 205 closes a switch S2 to discharge the sampling rail R to ground.

An ADC such as ADC 201 may be advantageously used in machine-learning pooling applications. Pooling is a down sampling technique from one layer to another to reduce the computation burden. There are at least three forms of pooling. In a first pooling form denoted herein as a maximum out (Maxout) pooling, it is conventional that the digital outputs from two or more filters are compared so that only the greatest digital output from the filters propagates to the next layer. For example, suppose there are 10 filter outputs but only the five greatest ones are allowed to propagate to the next layer. In a second pooling form denoted herein as a maximum pooling (Maxpool), the pooling is not across filters but instead is intra-filter. With regard to any given filter, it will process a first input vector and provide a first output, process a second input vector and provide a second output, and so on. In a Maxpool pooling, only the greatest output from a plurality of consecutive outputs over time propagates to the next layer. The down sampling in Maxpool is thus temporal. A third form of pooling is denoted herein as an average pooling (Avgpool). An Avgpool pooling is a variation of Maxpool pooling in that in Avgpool it is the average of the group of consecutive outputs that propagates to the next layer. The down sampling in average pooling is thus temporal in that it averages over a series of input vectors to the filters being pooled.

Figure 3:
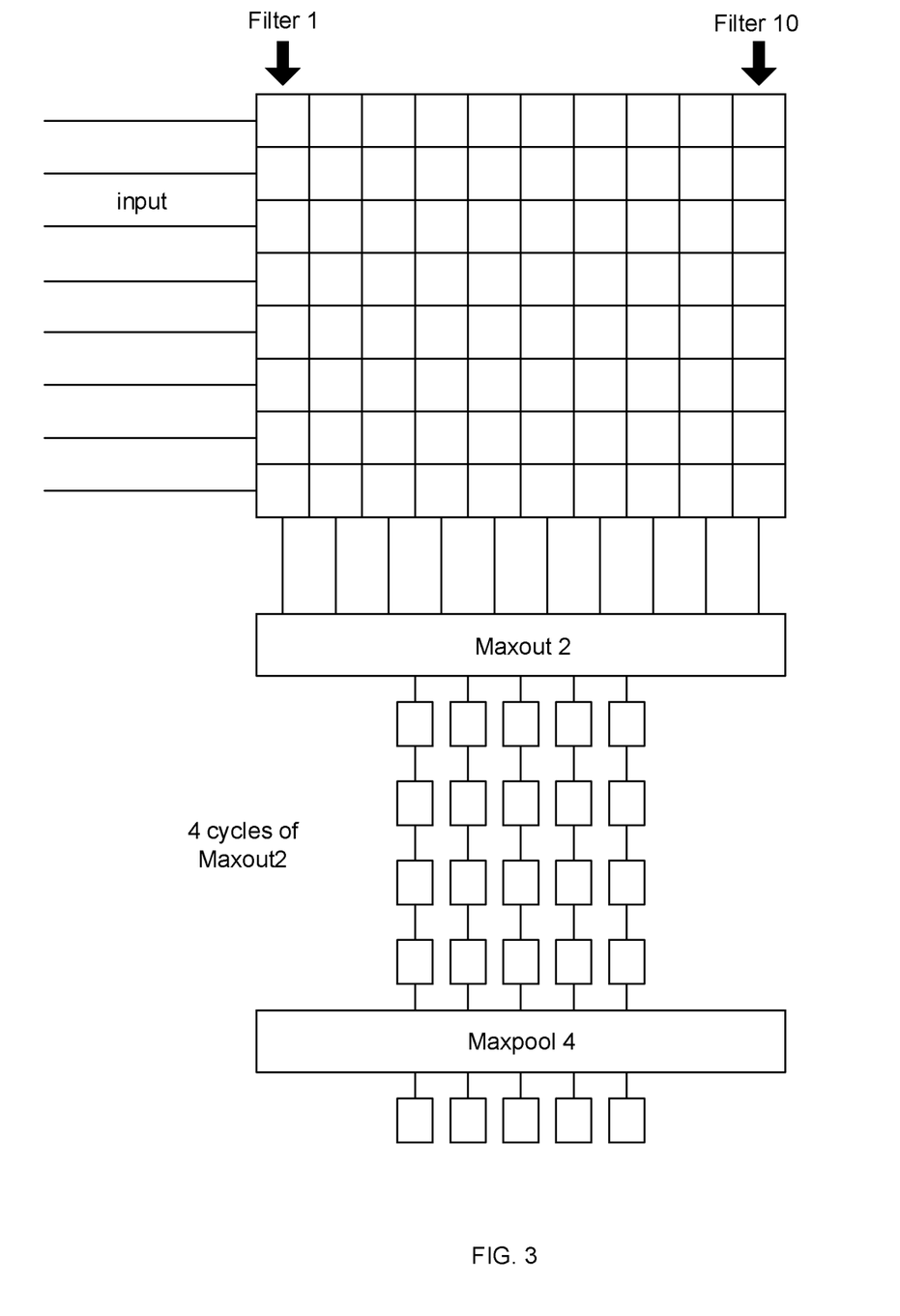
FIG. 3 illustrates an array of filters (CiM MAC circuits), a Maxout circuit, and a Maxpool circuit in accordance with an aspect of the disclosure.

From the preceding discussion, it can be seen that a Maxout pooling down samples the filters so that a reduced set of filter outputs propagates to the next layer. In contrast, the down sampling is temporal in a Maxpool or an Avgpool pooling. Note that a Maxout pooling and a temporal down sampling (either Maxpool or Avgpool) may be performed on the same layer. For example, a down sampling of the filters by one-half (Maxout 2) followed by a Maxpool down sampling by four (Maxpool 4) is shown in FIG. 3 for a plurality of 10 filters arranged from a first filter (filter 1) to a tenth filter (filter 10). Since it is a down sampling by two, there are five outputs from the Maxout 2 pooling. These five outputs are then sampled across four cycles of the input vector to the filters by the Maxpool 4 down sampling. The resulting five outputs would then propagate to the next layer (not illustrated).

It is conventional for the pooling schemes discussed above to be performed in the digital domain. The comparator in the ADC associated with each filter such as ADC 101 discussed previously must then make the necessary comparisons. The resulting comparator power consumption is a major contributor to the overall power consumption by a filter. But the pooling circuits disclosed herein advantageously limit the comparator power consumption. The implementation depends upon whether the filter output is a one-bit or a multi-bit output. For example, the Maxout 2 pooling shown in FIG. 3 is illustrated in greater detail as a one-bit Maxout 2 circuit 400 in FIG. 4. A first filter (filter 1) produces an MAC output voltage vin1 that is sampled by a CDAC 410. Similarly, a second filter (filter 2) produces a MAC output voltage vin2 that is sampled by a CDAC 405. CDAC 405 and 410 are both 3-bit converters but the precision of the converters may be varied in alternative implementations. CDAC 405 and 410 include the capacitors 8C, 4C, 2C, C, and C as well as switches S1 and S2 as discussed for CDAC 205. CDAC 405 is configured to subtract the difference between its threshold voltage vth2 and Vdd/2 from the MAC output voltage vin2 from filter 2. Similarly, CDAC 410 is configured to subtract the difference (vth1−Vdd/2) from the MAC output voltage vin1 from filter 1, where vth1 is the threshold voltage for CDAC 410. Given this subtraction, the corresponding comparators may compare their CDAC output voltages to the fixed threshold Vdd/2. Thus, a comparator 420 compares the CDAC output voltage from CDAC 410 to Vdd/2 to form a first comparator output signal (Comp1) that is asserted when the difference (vin1−Vth1) is greater than zero. Similarly, a comparator 415 compares the CDAC output voltage from CDAC 405 to Vdd/2 to form a second comparator output signal (Comp2) that is asserted when the difference (vin2−Vth2) is greater than zero. Comparators 415 and 420 may thus each have a simplified design as compared to a conventional full-rail comparator. Although comparators 415 and 420 are thus relatively-low power as compared to the use of full-rail comparators, additional power savings are achieved by time multiplexing the enabling of comparator 415 and 420. In particular, a first enable signal (en_ph1) enables comparator 420 whereas a second enable signal (en_ph2) enables comparator 415. The first enable signal is asserted prior to the assertion of the second enable signal. Comparator 420 will thus perform its comparison prior to the comparison by comparator 415.

Figure 4:
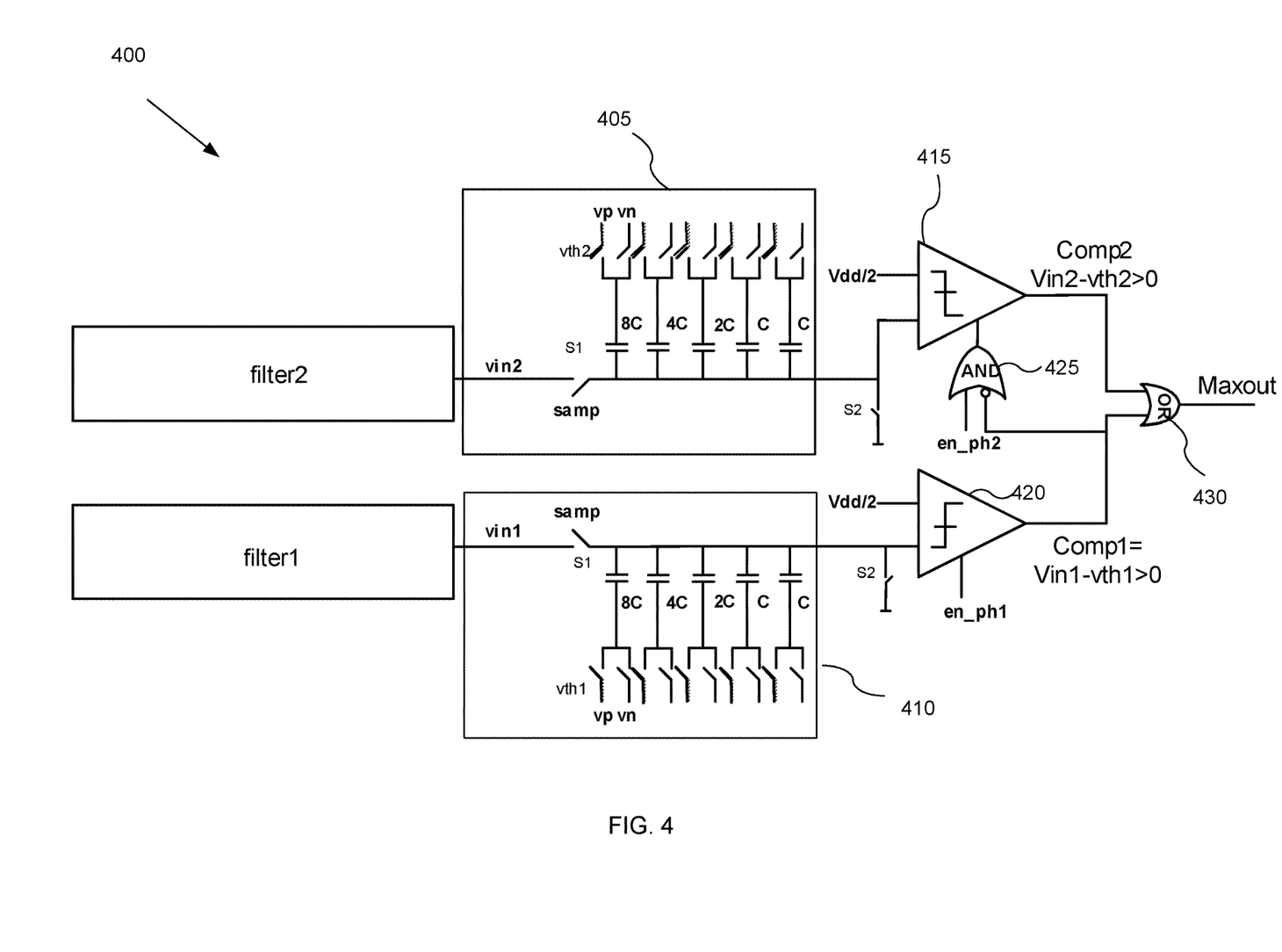
FIG. 4 illustrates a one-bit Maxout 2 circuit for processing the MAC output voltages from a pair of filters in accordance with an aspect of the disclosure.

To reduce the comparator power consumption even further, the first comparator output signal Comp1 prevents comparator 415 from being enabled if the first comparator output signal Comp1 is true. As used herein, a binary signal is deemed to be asserted if its logical state is true, regardless of whether that assertion is active-high or active-low. To accommodate this blocking, a logic gate such as an AND gate 425 performs a logical AND of the second enable signal en_ph2 with a complement of the first comparator output signal Comp1. If the first comparator output signal Comp1 is true, an output of AND gate 425 will then be false (de-asserted). The output of AND gate 425 drives an enable input for comparator 415 so that comparator 415 is not enabled if the first comparator output signal Comp1 is true. But if the first comparator output signal Comp1 is false and the second enable signal en_ph2 is enabled, AND gate 425 enables comparator 415. Comparator 415 is thus enabled only if the digitized output from filter 1 (the first comparator output signal Comp1) is a logic zero. Both the first comparator output signal Comp1 and the second comparator output signal Comp2 are ORed in an OR gate 430 to form the Maxout output signal for filters 1 and 2. When the first comparator output signal Comp1 is true, Maxout circuit 400 thus saves a substantial amount of power since comparator 415 is prevented from performing a needless comparison.

Figure 5:
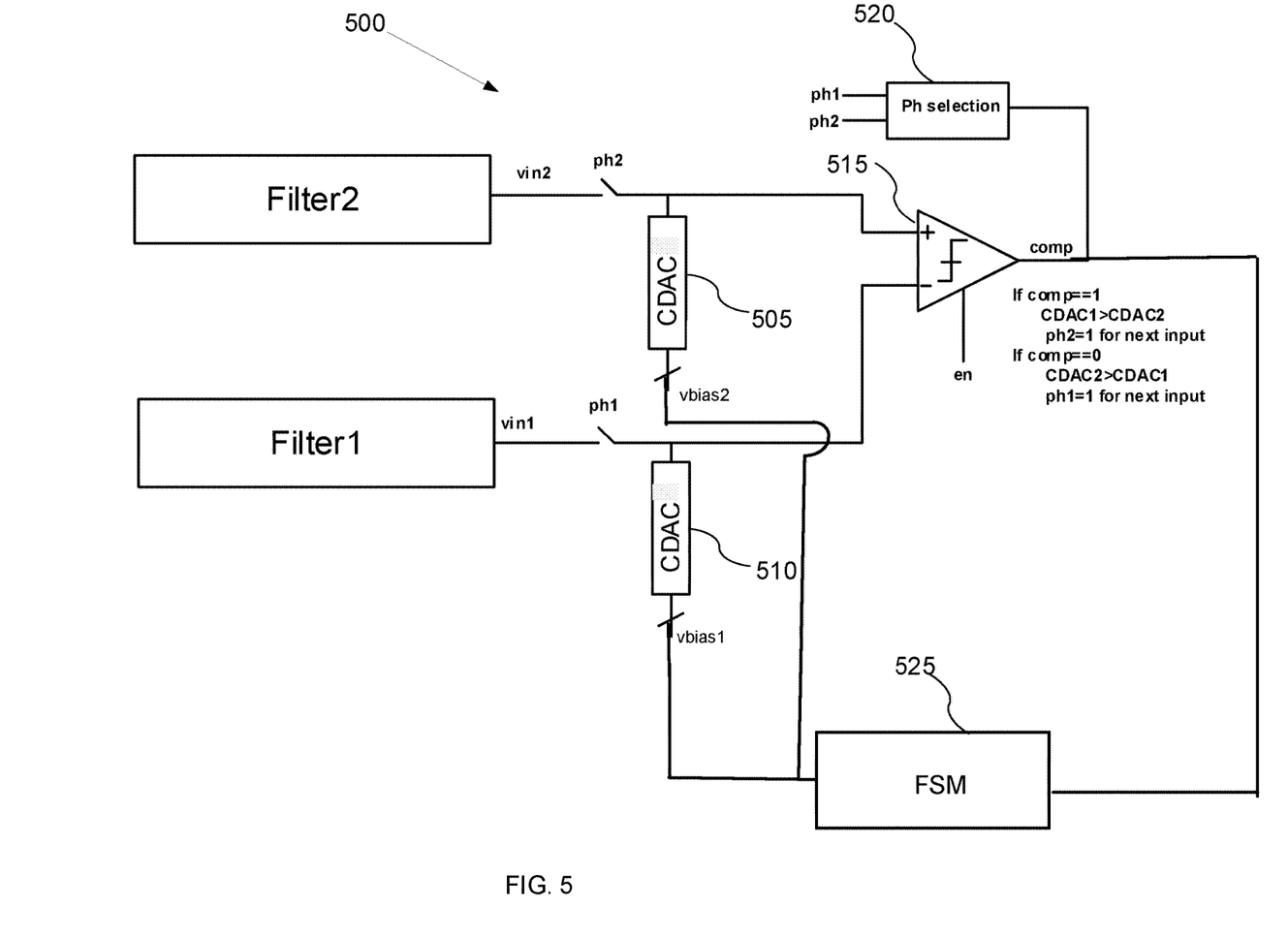
FIG. 5 illustrates a multi-bit Maxout 2 circuit for processing the MAC output voltages from a pair of filters in accordance with an aspect of the disclosure.

An example multi-bit Maxout 2 circuit 500 for producing a multi-bit output from a pair of filters is shown in FIG. 5. A first filter (Filter1) produces a MAC output voltage vin1 that is sampled by a CDAC 505 through a first sampling switch ph1. Similarly, a second filter (Filter2) produces a MAC output voltage vin2 that is sampled by a CDAC 510 through a second sampling switch ph2. A selection logic circuit 520 controls the sampling switches ph1 and ph2. To calculate the first bit (e.g., the most-significant bit) for the output from Maxout 2 circuit 500, selection logic circuit 520 closes both sampling switches ph1 and ph2. CDAC 505 subtracts a second bias voltage (vbias2) from the MAC output voltage vin2 for filter 2. The second bias voltage is the difference between the threshold voltage for CDAC 505 and VDD/2. Similarly, CDAC 510 subtracts a first bias voltage (vbias1) from the MAC output voltage vin1 for filter 1. The first bias voltage is the difference between the threshold voltage for CDAC 510 and VDD/2. A comparator 515 is then enabled by an enable signal (en) to compare the resulting output voltages from CDAC 505 and CDAC 510. It is arbitrary which filter ultimately drives the positive input or the negative input of comparator 515 so long as selection logic circuit 520 is configured accordingly. In Maxout 2 circuit 500, comparator 515 asserts a comparator output signal (comp) if the CDAC output voltage from CDAC 505 is greater than the CDAC output voltage from CDAC 510. Should the comparator output signal comp indicate that the CDAC output voltage from CDAC 505 is greater than the CDAC output voltage from CDAC 510, selection logic circuit 520 opens first sampling switch ph1 and closes second sampling switch ph2. CDAC 510 may then be configured so that its CDAC output voltage equals a reference voltage such as VDD/2. A finite state machine 525 functions as discussed for finite state machine 215 to control the second bias voltage vbias2 for CDAC 505 so that comparator 515 may successively determine the remaining bits for the digitization of the MAC output voltage vin2 from filter 2. Note that no power is then wasted calculating any additional bits for filter 1. Conversely, should the initial comparison by comparator 515 indicate that the CDAC output voltage from CDAC 510 was greater than the CDAC output voltage from CDAC 505, selection logic circuit 520 would close first sampling switch ph1 and open second sampling switch ph2. The remaining bits for the digitization of the MAC output voltage vin1 would be calculated without any power wasted on the digitization of additional bits for the digitization of the MAC output voltage vin2. Note that a non-linear activation may then be applied to the digital output from Maxout 2 circuit 500 since it is typical that the non-linear activations used in machine learning applications are monotonically increasing functions.

Figure 6:
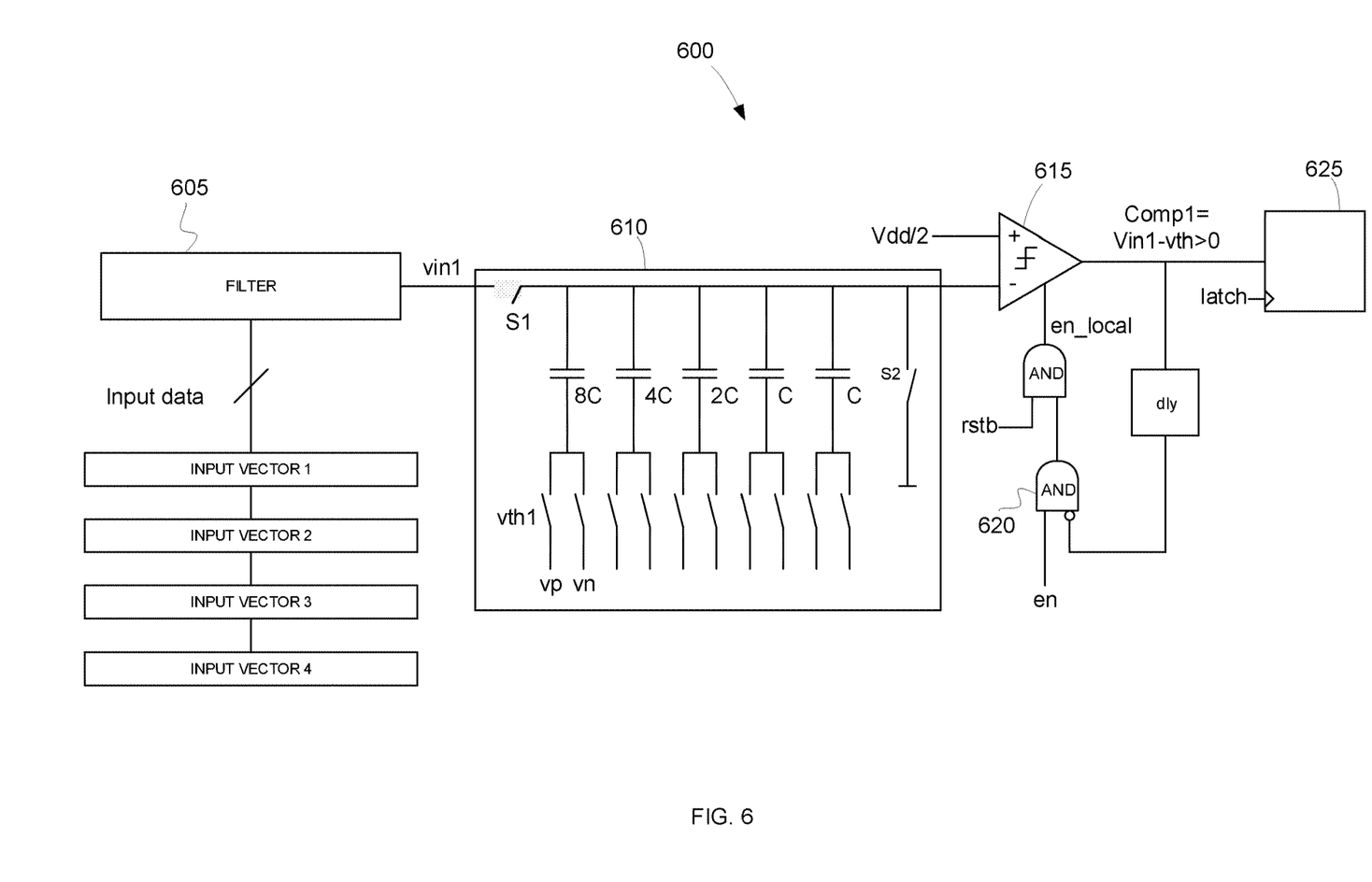
FIG. 6 illustrates a binary Maxpool 4 circuit for processing four consecutive MAC output voltages from a filter in accordance with an aspect of the disclosure.

A binary Maxpool 4 circuit 600 illustrated in FIG. 6 will now be discussed. A filter 605 successively processes four input vectors ranging from an input vector 1 to an input vector 4 to produce four successive MAC output voltages (vin1). A CDAC 610 functions as discussed for CDAC 205 to sample the MAC output voltage vin1 through sampling switch S1 and to subtract a bias voltage equaling the difference of its threshold voltage from the sampled MAC output voltage. CDAC 610 resets through switch S2 analogously as discussed for CDAC 205. A comparator 615 compares the CDAC output voltage to VDD/2 to make a bit decision as a comparator output signal Comp1. A delay circuit (dly) delays the comparator output signal to drive an inverting input of an AND gate 620. AND gate 620 receives an enable signal (en) that is asserted for each successive MAC output voltage digitization. AND gate 620 ANDS the enable with the delayed inverted comparator output signal. It is only if the comparator output signal is a binary false signal that an output of AND gate 620 becomes true. But if the comparator output signal is asserted, the output of AND gate 620 is then de-asserted. To allow for a reset function, the output of AND gate 620 is processed in a second AND gate with a complement reset signal (rstb). With the reset signal not asserted, the complement reset signal rstb is true so that the output of AND gate 620 propagates through the second AND gate to form a local enable signal (en_local) for comparator 615. Once the comparator output becomes true, comparator 615 will thus not be enabled for the remaining CDAC output voltages. After the four input vectors have been processed through filter 605, a latch signal is asserted so that a flip-flop 625 latches the comparator output signal.

Figure 7:
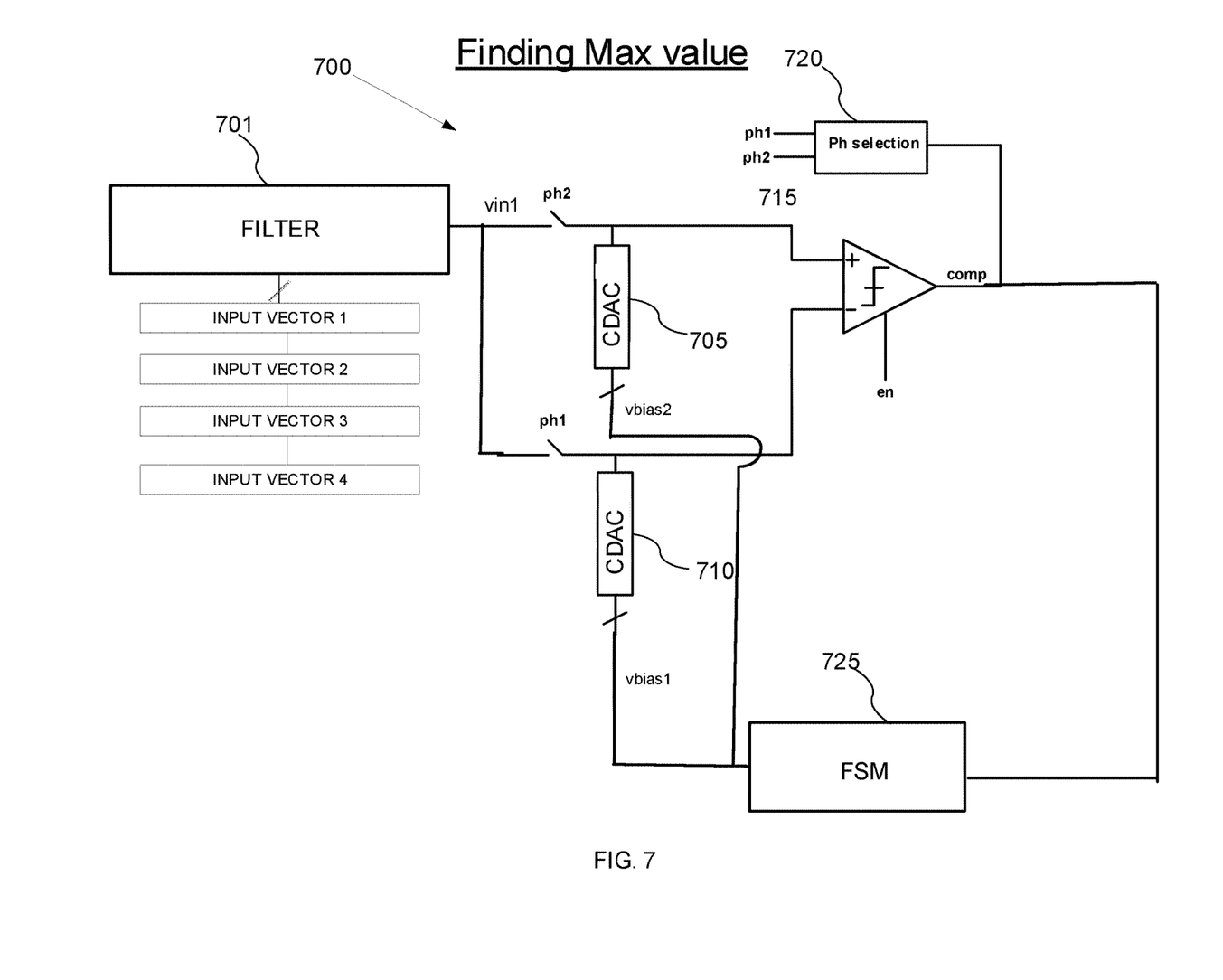
FIG. 7 illustrates a multi-bit Maxpool 4 circuit for processing four consecutive MAC output voltages from a filter in accordance with an aspect of the disclosure.

A multi-bit Maxpool 4 circuit 700 is shown in FIG. 7. Maxpool circuit 700 is analogous to Maxout circuit 500 except that there is just one filter 701 that is processing four consecutive input vectors ranging from an input vector 1 to an input vector 4. A CDAC 710 samples a MAC output voltage vin1 for a first one of the input vectors (input vector 1) processed by filter 701 through a first sampling switch ph1. Similarly, a CDAC 705 samples the MAC output voltage vin1 for a second one of the input vectors (input vector 2) processed by filter 701 through a second sampling switch ph2. Each CDAC 705 and 710 subtracts a bias voltage analogously as discussed for CDACs 505 and 510. A comparator 715 compares the resulting CDAC output voltages. A selection logic circuit 720 controls the sampling switches ph1 and ph2 so that CDAC having the smallest CDAC output voltage is overwritten with the MAC output voltage for the third input vector (input vector 3). Comparator 715 again determines the largest CDAC output voltage so that the CDAC with the smallest output voltage can again be overwritten with the MAC output voltage for the fourth input vector (input vector 4). Once the largest CDAC output voltage is determined, the remaining CDAC may be repurposed analogously as discussed for Maxout 2 circuit 500 to provide the reference voltage VDD/2 to comparator 715. A finite state machine 725 controls the threshold voltage in the CDAC with the greatest sampled voltage to calculate the remainder of the bits for the digitization of the MAC output voltage resulting from the corresponding input vector.

Figure 8:
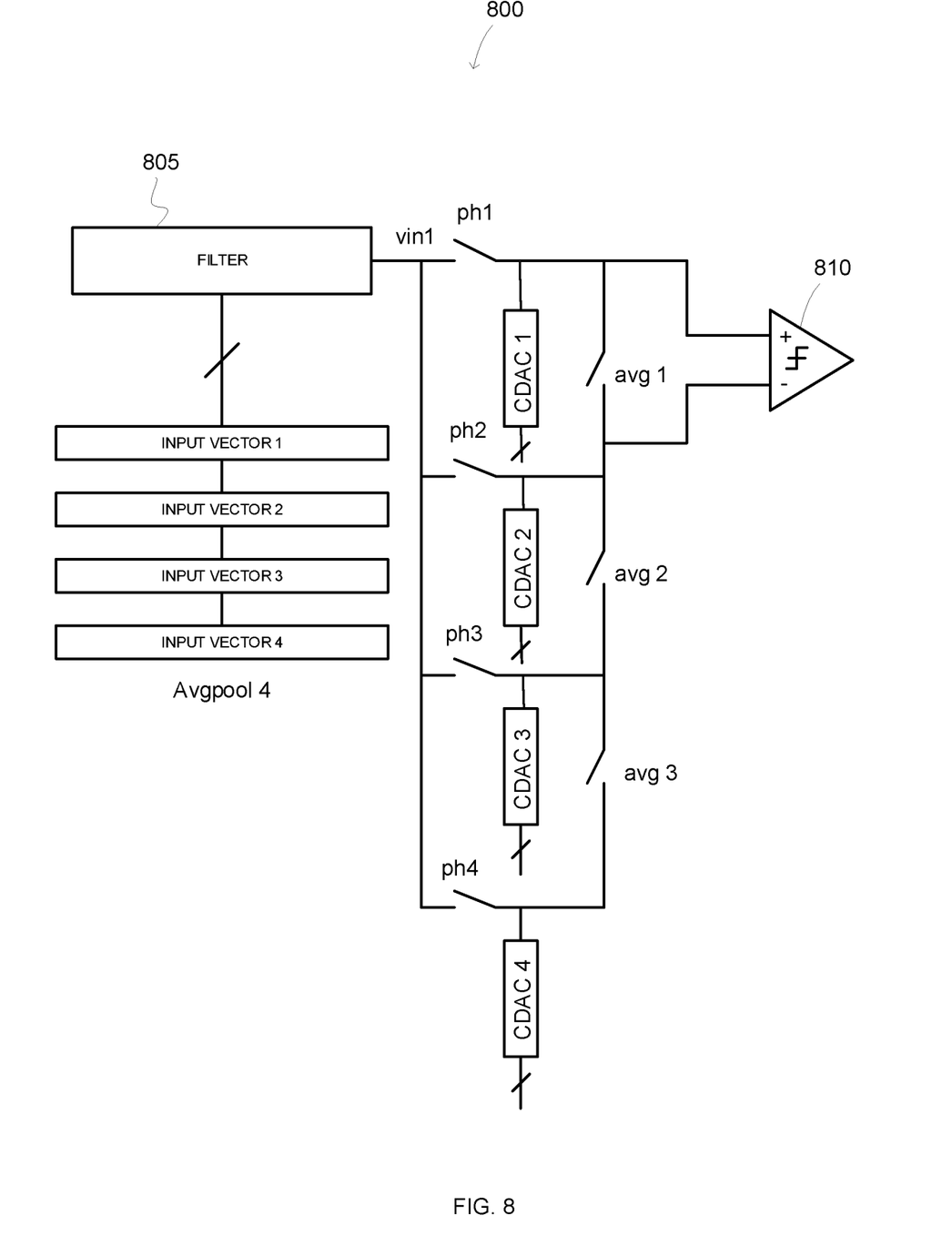
FIG. 8 illustrates a multi-bit Avgpool 4 circuit for processing four consecutive MAC output voltages from a filter in accordance with an aspect of the disclosure.

An Avgpool 4 circuit 800 is shown in FIG. 8. A filter 805 processes four input samples (input vectors) ranging from an input vector 1 to an input vector 4 to produce four successive samples of a MAC output voltage vin1. Each successive sample of the MAC output voltage vin1 is assigned to a corresponding CDAC through a corresponding sampling switch. There is a CDAC1 for sampling the MAC output voltage vin1 from the processing of the input vector 1, a CDAC2 for sampling the MAC output voltage vin1 from the processing of the input vector 2, a CDAC3 for sampling the MAC output voltage vin1 from the processing of the input vector 3, and a CDAC4 for sampling the MAC output voltage vin1 from the processing of the input vector 4. When a given one of the CDACs is sampling its MAC output voltage, the sampling switch for that CDAC is closed while the remaining sampling switches are open. There is a first sampling switch ph1 for CDAC1, a second sampling switch ph2 for CDAC2, a third sampling switch ph3 for CDAC3, and a fourth sampling switch for CDAC4. After each CDAC has sampled its respective MAC output voltage, the sampling switches are opened. Each CDAC functions to subtract a bias voltage from its sampled MAC output voltage analogously as discussed for CDACs 705 and 710.

When a particular sampling switch is closed, the other are opened. For example, a first sampling switch ph1 closes so that CDAC1 can sample the MAC output voltage (Vin1) resulting from the processing of the first input vector. Similarly, the second sampling switch ph2 closes so that CDAC2 can sample the MAC output voltage resulting from the processing of the second input vector. The third sampling switch ph3 then closes so that CDAC3 can sample the MAC output voltage resulting from the processing of the third input vector. Finally, the fourth sampling switch ph4 closes so that CDAC4 can sample the MAC output voltage resulting from the processing of the fourth input vector.

Once the CDACs have all sampled their MAC output voltages, an averaging phase commences. To perform the averaging, there is a first averaging switch avg1 extending between the output rail of CDAC1 to the output rail of CDAC2, a second averaging switch avg2 extending between the output rail of CDAC2 to the output rail of CDAC3, and a third averaging switch avg3 extending between the output rail of CDAC3 to the output rail of CDAC4. To perform the averaging of the CDAC output voltages, the three averaging switches avg1, avg2, and avg3 are closed simultaneously. The capacitors in the CDACs (see, e.g., CDAC 610) provide an inherent averaging function during the averaging phase. At the same time, each CDAC subtracts its threshold voltage (Vth). The resulting averaged voltage stored by the CDACs thus equals (Vin1+Vin2+Vin3+Vin4)/4−Vth.

Once the CDAC voltages are averaged and the threshold voltage subtracted, one of the CDACs (e.g., CDAC1) then functions to digitize the averaged CDAC voltage with a comparator 810 analogously as discussed with comparator 515. The corresponding finite state machine is not shown in FIG. 8 for illustration clarity. Another CDAC (e.g., CDAC2) can then be repurposed to provide the VDD/2 threshold voltage to comparator 810 while the averaged CDAC voltage is digitized.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A system for a machine learning application, comprising:
    a first multiply-and-accumulate (MAC) circuit including a first plurality of compute-in-memory bitcells configured to multiply a first plurality of stored weights with an input vector to provide a first MAC output voltage; and
    an analog-to-digital converter configured to digitize the first MAC output voltage, the analog-to-digital converter including:
    a first capacitive digital-to-analog converter (CDAC) configured to subtract a bias voltage from the first MAC output voltage to provide a first CDAC output voltage; and
    a first comparator configured to compare the first CDAC output voltage to a reference voltage to provide a first comparator output signal.

2. The system of claim 1, wherein the reference voltage is approximately one-half of a power supply voltage.

3. The system of claim 1, wherein the bias voltage equals a difference between a threshold voltage for the first CDAC and the reference voltage, the analog-to-digital converter further comprising a control logic circuit configured to control the threshold voltage.

4. The system of claim 3, wherein the control logic circuit is a finite state machine.

5. The system of claim 1, further comprising:
    a second MAC circuit including a second plurality of compute-in-memory bitcells configured to multiple a second plurality of stored weights with the input vector to provide a second MAC output voltage; and wherein the analog-to-digital converter further includes:
    a second CDAC configured to subtract the bias voltage from the second MAC output voltage to provide a second CDAC output voltage;
    a first logic gate configured to assert a local enable signal responsive to the first comparator output signal being false;
    a second comparator configured to respond to an assertion of the local enable signal to compare the second CDAC output voltage to the reference voltage to provide a second comparator output signal; and
    a second logic gate configured to provide a maximum pooling output signal for the first MAC circuit and for the second MAC circuit responsive to the first comparator output signal and to the second comparator output signal.

6. The system of claim 5, wherein the first logic gate is an AND gate configured to AND a complement of the first comparator output signal and a global enable signal to produce the local enable signal.

7. The system of claim 5, wherein the second logic gate is an OR gate configured to OR the first comparator output signal and the second comparator output signal to provide the maximum pooling output signal.

8. A system for a machine learning application, comprising:
    a first multiply-and-accumulate (MAC) circuit including a first plurality of compute-in-memory bitcells configured to multiply a first plurality of stored weights with an input vector to provide a first MAC output voltage;

a second MAC circuit including a second plurality of compute-in-memory bitcells configured to multiply a second plurality of stored weights with the input vector to provide a second MAC output voltage; and an analog-to-digital converter configured to digitize either the first MAC output voltage or the second MAC output voltage, the analog-to-digital converter including:

a first sampling switch;

a second sampling switch;

a first capacitive digital-to-analog converter (CDAC) configured to sample the first MAC output voltage through the first sampling switch to provide a sampled first MAC output voltage and to subtract a first bias voltage from the sampled first MAC output voltage to provide a first CDAC output voltage;

a second capacitive digital-to-analog converter (CDAC) configured to sample the second MAC output voltage through the second sampling switch to provide a sampled second MAC output voltage and to subtract a second bias voltage from the sampled second MAC output voltage to provide a second CDAC output voltage; and a comparator configured to assert a comparator output signal responsive to the first CDAC output voltage being greater than the second CDAC output voltage.

9. The system of claim 8, further comprising:

a selection logic circuit configured to close the first sampling switch and to open the second sampling switch responsive to an assertion of the comparator output signal; and a control logic circuit configured to control the first bias voltage during a digitization of the sampled first MAC output voltage by the first CDAC.

10. The system of claim 9, wherein the comparator is further configured to compare the first CDAC output voltage to a reference voltage during the digitization of the sampled first MAC output voltage by the first CDAC.

11. The system of claim 10, wherein the reference voltage is one-half of a power supply voltage.

12. A system for a machine learning application, comprising:

a multiply-and-accumulate (MAC) circuit including a plurality of compute-in-memory bitcells configured to multiply a plurality of stored weights with a first input vector to provide a first MAC output voltage and to multiply the plurality of stored weights with a second input vector to provide a second MAC output voltage; and an analog-to-digital converter configured to digitize either the first MAC output voltage or the second MAC output voltage, the analog-to-digital converter including:

a capacitive digital-to-analog converter (CDAC) configured to subtract a bias voltage from the first MAC output voltage to provide a first CDAC output voltage and to subtract the bias voltage from the second MAC output voltage to provide a second CDAC output voltage;

a comparator configured to compare the first CDAC output voltage to a reference voltage to provide a first comparator output signal responsive to a first assertion of a local enable signal; and a logic gate configured to perform a second assertion of the local enable signal responsive to the first comparator output signal being false, wherein the comparator is further configured to compare the second CDAC output voltage to the reference voltage to provide a second comparator output signal responsive to the second assertion of the local enable signal.

13. The system of claim 12, wherein the reference voltage is one-half of a power supply voltage.

14. The system of claim 12, wherein the logic gate is an AND gate.

15. The system of claim 12, wherein the logic gate comprises a pair of AND gates.

16. The system of claim 12, further comprising a delay circuit to delay the first comparator output signal.

17. The system of claim 12, further comprising a storage device configured to store the first comparator output signal and the second comparator output signal.

18. A system for a machine learning application, comprising:

a multiply-and-accumulate (MAC) circuit including a plurality of compute-in-memory bitcells configured to multiply a plurality of stored weights with a first input vector to provide a first MAC output voltage and to multiply the plurality of stored weights with a second input vector to provide a second MAC output voltage; and an analog-to-digital converter configured to digitize either the first MAC output voltage or the second MAC output voltage, the analog-to-digital converter including:

a first sampling switch;

a second sampling switch;

a first capacitive digital-to-analog converter (CDAC) configured to sample the first MAC output voltage through the first sampling switch to provide a sampled first MAC output voltage; and a second capacitive digital-to-analog converter (CDAC) configured to sample the second MAC output voltage through the second sampling switch to provide a sampled second MAC output voltage;

an averaging switch coupled between the first CDAC and the second CDAC, wherein the averaging switch is configured to close to average the sampled first MAC output voltage with the sampled second MAC output voltage to provide an averaged MAC output voltage; and a comparator configured to compare the averaged MAC output voltage to a reference voltage to provide a comparator output signal.

19. The system of claim 18, wherein the reference voltage is approximately one-half a power supply voltage.

20. The system of claim 18, wherein the first CDAC is further configured to subtract a bias voltage from the averaged voltage, the analog-to-digital converter further comprising a control logic circuit configured to control the bias voltage.

21. The system of claim 18, wherein the first CDAC and the second CDAC are 3-bit CDACs.

22. The system of claim 18, wherein the MAC circuit includes a read bit line, and wherein each compute-in-memory bitcell includes:

a pair of cross-coupled inverters having a first output node for a weight bit;

a word line having a voltage responsive to an input vector bit;

a capacitor having a first plate connected to the read bit line; and a first pass transistor connected between the first output node and a second plate of the capacitor and having a gate connected to the word line.

23. The system of claim 22, wherein each first pass transistor comprises a p-type metal-oxide-semiconductor (PMOS) transistor.

24. The system of claim 22, wherein each compute-in-memory bitcell further comprises:
a read word line; and
a transistor coupled between the second plate of the capacitor and ground and having a gate connected to the read word line.

25. The system of claim 22, wherein the MAC circuit is configured to pre-charge the read bit line to a power supply voltage.

* * * * *